(12) United States Patent
Guo et al.

(10) Patent No.: US 12,341,017 B2
(45) Date of Patent: Jun. 24, 2025

(54) ETCHING METHODS WITH ALTERNATING NON-PLASMA AND PLASMA ETCHING PROCESSES

(71) Applicant: American Air Liquide, Inc., Fremont, CA (US)

(72) Inventors: Xiangyu Guo, Bear, DE (US); Nathan Stafford, Bear, DE (US)

(73) Assignee: American Air Liquide, Inc., Fremont, CA (US)

(*) Notice: Subject to any disclaimer, the term of this patent is extended or adjusted under 35 U.S.C. 154(b) by 238 days.

(21) Appl. No.: 17/974,246

(22) Filed: Oct. 26, 2022

(65) Prior Publication Data

US 2024/0162042 A1 May 16, 2024

(51) Int. Cl.
*H01L 21/3065* (2006.01)

(52) U.S. Cl.
CPC .............................. *H01L 21/30655* (2013.01)

(58) Field of Classification Search
CPC .................................................. H01L 21/00–86
See application file for complete search history.

(56) References Cited

U.S. PATENT DOCUMENTS

| | | | |
|---|---|---|---|
| 9,542,158 B2 | 1/2017 | Tie et al. | |
| 9,673,058 B1 | 6/2017 | Briggs et al. | |
| 10,361,092 B1 | 7/2019 | Roberts et al. | |
| 10,741,407 B2 | 8/2020 | Dole et al. | |
| 2004/0072430 A1 | 4/2004 | Huang et al. | |
| 2016/0163557 A1 | 6/2016 | Hudson et al. | |
| 2016/0163561 A1 | 6/2016 | Hudson et al. | |
| 2016/0343580 A1 | 11/2016 | Hudson | |
| 2017/0178920 A1 | 6/2017 | Dole et al. | |
| 2018/0286707 A1 | 10/2018 | Hudson et al. | |
| 2020/0010630 A1* | 1/2020 | Urabe | C08J 9/40 |
| 2021/0020450 A1* | 1/2021 | Abe | H01L 21/0206 |
| 2021/0098263 A1 | 4/2021 | Ishikawa et al. | |
| 2021/0202260 A1 | 7/2021 | Ishikawa et al. | |

(Continued)

FOREIGN PATENT DOCUMENTS

| | | | |
|---|---|---|---|
| JP | 2009206444 A | * | 9/2009 |
| JP | 2014 150149 | | 8/2014 |

OTHER PUBLICATIONS

NIST—Cyclopentene, octafluoro—(Year: 2024).*

(Continued)

*Primary Examiner* — Joshua L Allen
*Assistant Examiner* — Andrew Keelan Laobak
(74) *Attorney, Agent, or Firm* — Yan Jiang

(57) ABSTRACT

A method for forming an aperture pattern in a substrate, the substrate including a film disposed thereon and a patterned mask layer disposed on the film, comprises 1) exposing the substrate to a vapor of a passivation molecule in a non-plasma condition for a period to form a surface protective layer on the patterned mask layer, 2) exposing the substrate to a plasma activated etch gas and plasma dry etching the substrate to form apertures over the patterned mask layer in the film with the plasma activated etch gas, and 3) repeating step 1) and 2) until a desired aperture pattern is formed in the film, wherein the surface protective layer is also formed on the sidewalls of the apertures formed in the film, wherein the passivation molecule has a boiling point equal to or larger than 20° C.

19 Claims, 4 Drawing Sheets

(56) References Cited

U.S. PATENT DOCUMENTS

| | | | |
|---|---|---|---|
| 2021/0242032 A1* | 8/2021 | Colinjivadi | ........ H01L 21/68785 |
| 2021/0265169 A1 | 8/2021 | Yamaguchi et al. | |
| 2021/0332479 A1 | 10/2021 | Kim et al. | |
| 2022/0093388 A1 | 3/2022 | Nakatani et al. | |
| 2022/0199418 A1 | 6/2022 | Zhang et al. | |
| 2022/0223431 A1* | 7/2022 | Guo | ................. H01L 21/31144 |

OTHER PUBLICATIONS

CAS Common Chemistry—Perfluorodecane (Year: 2024).*
Zhang, L. et al., Improved plasma resistance for porous low-k dielectrics by pore stuffing approach, ECS Journal of Solid State Science and Technology, 4(1), N3098-N3107 (2015).
International Search Report and Written Opinion for corresponding PCT/US2023/036023, Jan. 9, 2024.

* cited by examiner

ETCHING METHODS WITH ALTERNATING NON-PLASMA AND PLASMA ETCHING PROCESSES

TECHNICAL FIELD

The present invention is related to etching methods using passivation molecules that either condense, chemisorb or chemically react with a surface to form a protection layer on the surface with alternating non-plasma and plasma etching processes.

BACKGROUND

In a continuous plasma-etch process, surface modification (activation) and energetic material removal (desorption) occur concurrently. Concurrence is problematic, however, because changing plasma parameters to improve one aspect may degrade another. For silicon-based dielectric etch, balancing the ratio of active radicals (such as F, Cl) to passivate radicals (such as H, CH—) is important and needs to be optimized such that appropriate chemical reactions occur to form either easily exhausted volatile byproducts or protective deposits on the remainder (selectivity and profile control). However, fluorinated chemistry typically is accompanied by undercutting and the proximity effect and is limited to the formation of relatively wide shallow groove or trenches. Chlorinated gas chemistry has profile control problems, is subject to phenomena such as black silicon.

Therefore, new etch chemistries has been consistently developed innovatively to evolve etch challenges which may arise from ever-decreasing device sizes; changes in materials used, such as high-k or low-k dielectrics; diversification in device architecture, such as FinFETs and 3D NAND transistors, and new packaging approaches, such as TSV technology. For this matter, heavier compounds, which usually have a high boiling point, have been widely studied recently for etching semiconductor materials to form deep narrow trenches with a controlled profile. At meanwhile, novel processes, such as multi-step etch, combination of depo/etch, etc., are developed to etch structures with aspect ratio of desired or more.

Plasma etching in high aspect ratio structures is a complicated process utilizing a number of different fluorocarbon etching gases to control its etch rate, selectivity to the mask, and profile control. The sidewall passivation layer is critical for controlling the profile and reduce bowing. The polymer deposited by the fluorocarbon gases also helps protect the carbon mask from the bombarding $Ar^+$ ions as well as the oxygen radicals. Mask selectivity may be improved by both the surface coating to resist the etching as well as conductive sidewall passivation layers to increase the etching rate.

US20210020450 discloses an etching method according to one embodiment, includes alternately switching a first step and a second step. The first step introduces a first gas containing a fluorine atom without supplying radiofrequency voltage to form a surface layer on a surface of a target cooled at a temperature equal to or lower than a liquefaction temperature of the first gas. The second step introduces a second gas gaseous at the first temperature and different from the first gas, and supplies the radiofrequency voltage, to generate plasma from the second gas to etch the target by sputtering using the plasma. The first gas contains fluoride gas represented by a composition formula $C_xH_yF_z$ where $x \geq 1$, $y \geq 0$, $z \geq 2$. It limits the first gas to F-containing gases.

US20210202260 discloses a technique enables etching of a film on a substrate with reduced etching on the surface of a sidewall. An etching method includes forming a protective layer on a surface of aside wall defining a recess in a substrate. The protective layer contains sulfur atoms. The etching method further includes etching a film on the substrate to increase a depth of the recess after forming the protective layer. The protective layer on a surface is formed under plasma condition. A few examples are given including $CHF_3$.

Zhang et al. ("Improved Plasma Resistance for Porous Low-k Dielectrics", ECS J. Solid State Sci. Tech., 4, N3098-N3107, 2015 and PESM2014, Grenoble, France) discloses low damage integration of ultralow-k porous organosilicate glasses by pore-stuffing approach. Zhang et al. introduce the concept of "capillary condensation" and let the liquid precursors condense into the micro pores of the low-k dielectric materials (so-called low-k stuffing), even with lower pressure than vapor pressure. The benefit of the pore stuffing is to improve significantly the trench sidewall damage, as protection is achieved independently of the etch by-products. In the low-k stuffing process, stuffed samples are prepared in four steps: surface pretreatment, polymer spin coating, thermal drive-in and surface cleaning. It relies on the unique porous structure of low-k materials (no reported results on non-porous materials). There should be no impinge on Zhang et al.'s disclosure. The pore stuffing was performed in several ways:

1) pore filling in cryogenic temperature, utilizing liquid condensation;
2) depositing polymer on the low-k surface by spin coating polymer solutions. By thermal annealing well above the glass transition of the polymer, solvents evaporate and polymers penetrate into the porous low-k structure.

U.S. Pat. No. 9,543,158 to Nikhil et al. discloses various methods, apparatus and systems for forming a recessed feature in dielectric material on a substrate. In some cases the protective coating is deposited using plasma assisted atomic layer deposition, a modified plasma assisted atomic layer deposition, or plasma assisted chemical vapor deposition. U.S. Pat. No. 10,170,324B2 is similar. In these patents, protective coatings are deposited with a precursor reactant of many different types of families and a co-reagent to form a deposited layer on the sidewall, which are performed in a cyclic etch manner of etch/depo.

U.S. Pat. No. 10,361,092 describes the addition of metal containing component into the etching process along with fluorocarbon etching gases, where the metal component selected from at least one of tungsten (W), tin (Sn), molybdenum (Mo), ruthenium (Ru), titanium (Ti), or tantalum (Ta); and the sources of the metals may include $WF_6$, $TiCl_4$, $TiF_4$, $SnH_4$, $TaF_5$, $RuF_6$, and $SnCl_4$.

U.S. Pat. No. 10,741,407 describes a method where a metal containing gas $WF_6$ is added into the high aspect ratio etching to improve the sidewall protection by reducing or eliminating problematic sidewall notching.

US20210242032 describes a method of depositing a metal containing protective film on the sidewalls of the feature, utilizing an etch and deposition cyclic process in which the protective film is tungsten carbonitride, a tungsten sulfide, tin, a tin-containing compound, molybdenum, a molybdenum-containing compound, a ruthenium sulfide, an aluminum sulfide, zirconium, and a zirconium-containing compound.

U.S. Pat. No. 9,673,058 describes a method where a W (tungsten) containing gas such as $WF_6$, $WF_6Cl$, $WBr_6$, W(CO)$_6$, or WCl$_6$ is added to a carbon containing passivating gas such as a hydrocarbon, fluorohydrocarbon, or fluorocarbon gas to etch features into a silicon oxide containing film forming a sidewall passivation layer of tungsten and carbon containing passivation. The addition of W is expected to improve the etch resistance of the sidewall passivation layer.

US20180286707A1 describes a method of etching a high aspect ratio structure in a cyclic and cryogenic etch process (<−20° C.). The method includes a) receiving a substrate in the substrate holder; (b) cooling the substrate by cooling a chiller chamber to a temperature of about −20° C. or lower; and (c) flowing a mixture of reactants into the chamber, using the plasma source to generate a plasma from the mixture of reactants, and etching the dielectric material of the substrate to form the feature in the substrate, where the mixture of reactants includes at least one reactant selected from the group consisting of: an iodine-containing fluorocarbon, a bromine-containing fluorocarbon, an iodine-containing fluoride, HI, HBr, IBr, SF$_6$, SO$_2$, CS$_2$, COS, CF$_4$, C$_2$F$_6$, C$_3$F$_8$, C$_4$F$_{10}$, CHF$_3$, and C$_2$HF$_5$. Cryogenic etching temperatures may be used to tune the sticking coefficients for the various reactants and other species present during etching.

US 20220199418 discloses a method for processing a substrate that includes performing a cyclic plasma etch process including two plasma steps and one of the steps includes a silicon molecule.

Despite the wide range of choices available for etching using Si-containing etchants, additional etchants are continuously sought to provide device engineers the ability to tune etching conditions and manufacturing process requirements and achieve etching targets with desirable etch rate, selectivity to the mask, and profile control.

SUMMARY

Disclosed is a method for forming an aperture pattern in a substrate, the substrate including a film disposed thereon and a patterned mask layer disposed on the film, the method comprising the steps of:
1) exposing the substrate to a vapor of a passivation molecule in a non-plasma condition for a period to form a surface protective layer on the patterned mask layer;
2) exposing the substrate to a plasma activated etch gas and plasma dry etching the substrate to form apertures over the patterned mask layer in the film with the plasma activated etch gas; and
3) repeating step 1) and 2) until a desired aperture pattern is formed in the film, wherein the surface protective layer is also formed on the sidewalls of the apertures formed in the film. The disclosed methods may include one or more of the following aspects:
- step 1) and step 2) being not proceeded simultaneously;
- a vaporization temperature of the passivation molecule being greater than a process temperature in step 1);
- the process temperature in step 1) being the same as a process temperature in step 2);
- the process temperature in step 1) ranging from −150° C. to 100° C.;
- the process temperature in step 1) ranging from −50° C. to 50° C.;
- the process temperature in step 2) ranging from −150° C. to 50° C.;
- the process temperature in step 2) being 20° C.;
- the passivation molecule having a boiling point equal to or larger than 20° C.;
- the passivation molecule being selected from the group consisting of halogen-containing silanes, hydrofluorocarbons, 1-containing hydrofluorocarbons, N-containing hydrofluorocarbons and S-containing hydrofluorocarbons;
- the passivation molecule being SiH$_2$I$_2$;
- the passivation molecule being mixed with an inert gas selected from Ar, N$_2$, Xe, Kr, Ne, or combinations thereof;
- the etch gas having a formula: C$_x$H$_y$F$_z$, where x=1-6, y=0-3, z=1-10;
- the etch gas being a C$_1$-C$_6$ fluorocarbon gas selected from CF$_4$, C$_2$F$_4$, C$_2$F$_6$, C$_3$F$_8$, C$_3$F$_6$, C$_4$F$_6$, C$_4$F$_8$, C$_4$F$_{10}$, C$_5$F$_8$ or C$_6$F$_6$, or a C$_1$-C$_6$ hydrofluorocarbon gas selected from CH$_3$F, CH$_2$F$_2$, CHF$_3$, C$_2$H$_5$F, C$_3$H$_7$F, C$_4$H$_2$F$_6$, C$_3$H$_2$F$_6$, or C$_2$HF$_5$;
- the etch gas being C$_4$F$_6$;
- the etch gas being CHF$_3$;
- a process pressure in step 1) ranging from 0.001 torr to 50 torr;
- a process pressure in step 1) ranges from 300 mtorr to 1 torr;
- the period in step 1) varying from 0.01 sec to 10000 sec;
- the period in step 1) varying from 1 sec to 60 sec;
- a plasma process time in step 2) varying from 0.01 sec to 10000 sec;
- a plasma process time in step 2) varying from 1 sec to 60 sec;
- the film being a SiO$_2$, SiN, SiC, SiCN, or SiON layer or an alternating SiO/SiN or SiO/p-Si layer;
- further comprising adding an oxidizer selected from O$_2$, CO, CO$_2$, NO, NO$_2$, N$_2$O to the plasma activated etch gas, wherein the oxidizer is plasma activated;
- further comprising the step of purging with an inert gas between the exposing steps;
- further comprising the step of pumping down using a vacuum pump to a process pressure between the exposing steps; and
- further comprising the step of pumping down using a vacuum pump to a base pressure of the vacuum pump between the exposing steps.

Also disclosed is a method for forming an aperture pattern in a substrate, the substrate including an film disposed thereon and a patterned mask layer disposed on the oxide layer, the method comprising:
1) exposing the substrate to a gas of a passivation molecule in a non-plasma condition for a period to form a surface protective layer on the patterned mask layer;
2) exposing the substrate to a plasma activated etch gas and plasma dry etching the substrate to form apertures over the patterned mask layer in the oxide layer with the plasma activated etch gas; and
3) repeating step 1) and 2) until a desired oxide aperture pattern is formed in the oxide layer,
   wherein the surface protective layer is also formed on the sidewalls of the apertures in the oxide layer. The disclosed method may include one or more of the following aspects:
- a vaporization temperature of the passivation molecule being greater than a process temperature in step 1); and
- further comprising adding an oxidizer selected from O$_2$, CO, CO$_2$, NO, NO$_2$, N$_2$O to the plasma activated etch gas, wherein the oxidizer is plasma activated.

Also disclosed is a method forming an aperture pattern in a substrate, the substrate including a film disposed thereon and a patterned mask layer disposed on the film, the method comprising:

1) exposing the substrate $SiH_2I_2$ vapor in a non-plasma condition for a period to form a surface protective layer on the patterned mask layer;
2) exposing the substrate to a plasma activated fluorocarbon or hydrofluorocarbon etch gas and plasma dry etching the substrate to form apertures over the patterned mask layer in the film with the plasma activated fluorocarbon or hydrofluorocarbon etch gas; and
3) repeating step 1) and 2) until a desired aperture pattern is formed in the film, wherein the surface protective layer is also formed on the sidewalls of the apertures in the film. The disclosed method may include one or more of the following aspects:
a vaporization temperature of the passivation molecule is greater than a process temperature in step 1).

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from previous manufacturing steps. For example, the wafers may include silicon layers (including, but not limited to, crystalline, amorphous, porous, etc.), silicon containing layers (including, but not limited to, $SiO_2$, SiN, SiON, SiCOH, etc.), metal or metal containing layers (including, but not limited to, copper, cobalt, ruthenium, tungsten, platinum, palladium, nickel, ruthenium, gold, etc.) or combinations thereof. Furthermore, the substrate may be planar or patterned. The substrate may be an organic patterned Iodinated carbon layer film. The substrate may include layers of oxides which are used as dielectric materials in field effect transistor (FET) such as FinFET, MOFSET, GAAFET (Gate all-around FET), Ribbon-FET, Nanosheet, Forksheet FET, Complementary FET (CFET), MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. The substrate may include layers of alternating oxides (e.g., SiO) and nitrides (e.g., SiN). One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate may be any solid that has functional groups on its surface that are prone to react with the reactive head of a self-assembled monolayer (SAM), and may include without limitation 3D objects or powders.

The term "wafer" or "patterned wafer" refers to a wafer that has a stack of films on a substrate, at least the top-most film the stack of the films has topographic features or patterns that have been created in steps prior to etch and the patterned top-most film on is formed for pattern etch.

The term "processing" as used herein includes patterning, exposure, development, etching, deposition, cleaning, and/or removal of by-products, as required in forming a described structure.

The term of "deposit" or "deposition" refers to a series of processes where materials at atomic or molecular levels are deposited on a wafer surface or on a substrate from a gas state (vapor) to a solid state as a thin layer. Chemical reactions are involved in the process, which occur after creation of a plasma of the reacting gases or activation of the reacting gases by heat. The plasma may be capacitively coupled plasma (CCP), Inductively coupled plasma (ICP), electron cyclotron resonance (ECR) plasma, or a microwave plasma, but is not limited to. Suitable commercially available plasma etching chambers include but are not limited to the Lam Research Dual CCP reactive ion etcher Dielectric etch product family sold under the trademark Flex™ or the Tokyo Electron Tactras™ or Episode™ UL. The non-plasma exposure step may be performed in a different chamber than the plasma exposure step.

The term "aspect ratio" refers to a ratio of the height of a trench (or aperture) to the width of the trench (or the diameter of the aperture).

The term "passivating chemistries", "passivation chemistries", "passivating chemicals", "passivation chemicals", "passivating molecules" or "passivation molecules" refers to the molecules that either condense, chemisorb or chemically react with the surface to form a protection layer. This passivation layer may be a monolayer or multiple molecule layers in thickness depending on the mechanism involved with the passivation. The passivation molecules herein have a boiling point of 20° C. or higher.

The term "vaporization temperature" used herein refers to a temperature that a passivation molecule vaporizes at a reduced pressure comparing to atmosphere pressure or a pressure different from atmosphere pressure. The vaporization temperature is the boiling point of the passivation molecule at atmosphere pressure.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole" and "trench" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "etch gas" and "etchant" may be used interchangeably when the etch gas is in a gaseous state at room temperature and ambient pressure. It is understood that an etch gas may correspond to, or be related to an etchant, and that the etchant may refer to the etch gas.

The terms "dope" or "doping" is used interchangeably to the process of incorporation of one or more elements into a film through various methods where that element may be chemically bond or physically bond, and the process of intentionally incorporating atoms of different elements into the film composition. The element(s) may be doped interstitial or substitutional within the film.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
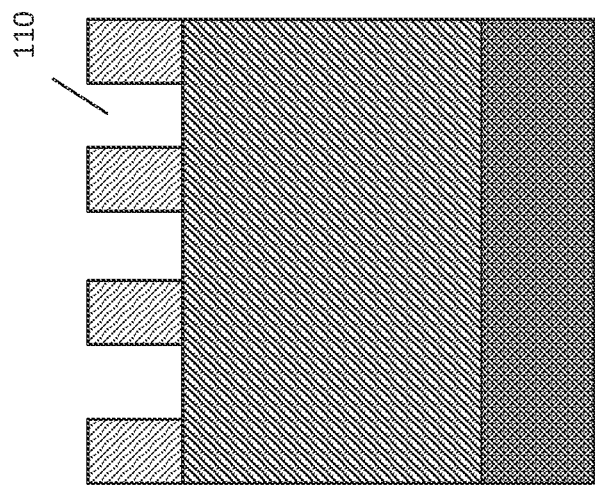
FIG. 1A shows an exemplary patterned structures of oxide hole pattern on Si substrate or a wafer before mask opening.

Disclosed are etching methods comprising using passivation molecules that either condense, chemisorb or chemically react with a surface of a substrate to form a surface protective layer without use of plasma before a plasma etching step. The disclosed methods comprise multiple steps by alternately switching step 1) and step 2), in which step 1) is forming a surface protective layer by exposing a substrate to a vapor of a passivation molecule in a non-plasma condition for a certain period to form the surface protective layer on the substrate; and step 2) is plasma dry etching the substrate that has the surface protective layer formed thereon using an etch gas or a reactive reagent, such as, a fluorocarbon or hydrofluorocarbon etching gas, and one or more oxidizers. The surface protective layer may or may not be a polymer layer and may or may not be washable with existing clean methods. One extra cleaning step may be added to the end of step 2) to clean the surface of the substrate with existing clean methods known in the art. The cleaning methods may include but not limited to plasma cleaning step such as using $O_2$ or $CF_4$ or wet cleaning methods involving reagents such as solvents, water or HF. The certain period in step 2) may range from 0.01 sec to 10000 seconds, but not limited to it and until the surface passivation layer of Step 1) is removed. These steps may be cycled, if necessary. The number of cycles is not limited and the cyclic process may be completed until the surface protective layer is completely etched. Between steps in a cycle, a purging step may be applied or a pumping down step using a vacuum pump to a process pressure or a base pressure of the vacuum pump. These steps are proceeded sequentially rather than simultaneously. Step 1) and Step 2) are not proceeded simultaneously.

The disclosed passivation molecules have a boiling point greater than 20° C. or greater than room temperature. A process temperature in step 1) may be less than the boiling point of the passivation molecules. A process temperature in step 2) may range from −50° C. to 50° C., preferably at room temperature or 20° C., which makes the entire process easy to control and commercially inexpensive. The process temperature in step 1) may be the same as the process temperature in step 2).

The disclosed passivation molecules may include fluorocarbon or hydrofluorocarbon molecules (e.g., $C_xH_aF_y$, x=1-6, a=0-7, y=0-10) with halogen element, such as Cl, Br and I, substitutions and organic or inorganic Si-containing deposition precursors.

The disclosed passivation molecules may be halogen-containing silanes, hydrofluorocarbons, I-containing hydrofluorocarbons, N-containing hydrofluorocarbons and S-containing hydrofluorocarbons.

More specifically, the disclosed passivation molecules with boiling point greater than 20° C. may be as follows.

A) Halogen-containing silanes, $SiR_xF_yI_z$, wherein x+y+z=4; 0≤y≤4; 0≤z≤4; R is selected from H, a $C_1$-$C_{10}$ linear, branched, saturated or unsaturated, partially or fully fluorinated, substituted or unsubstituted, amino and nitrogen containing alkyl group, a $C_3$-$C_{10}$ cyclic, heterocyclic, aromatic, amino and nitrogen containing alkyl group. When x>1, the R terminals may also be linked to form a cyclic group.

Examples of known compounds of this category include:

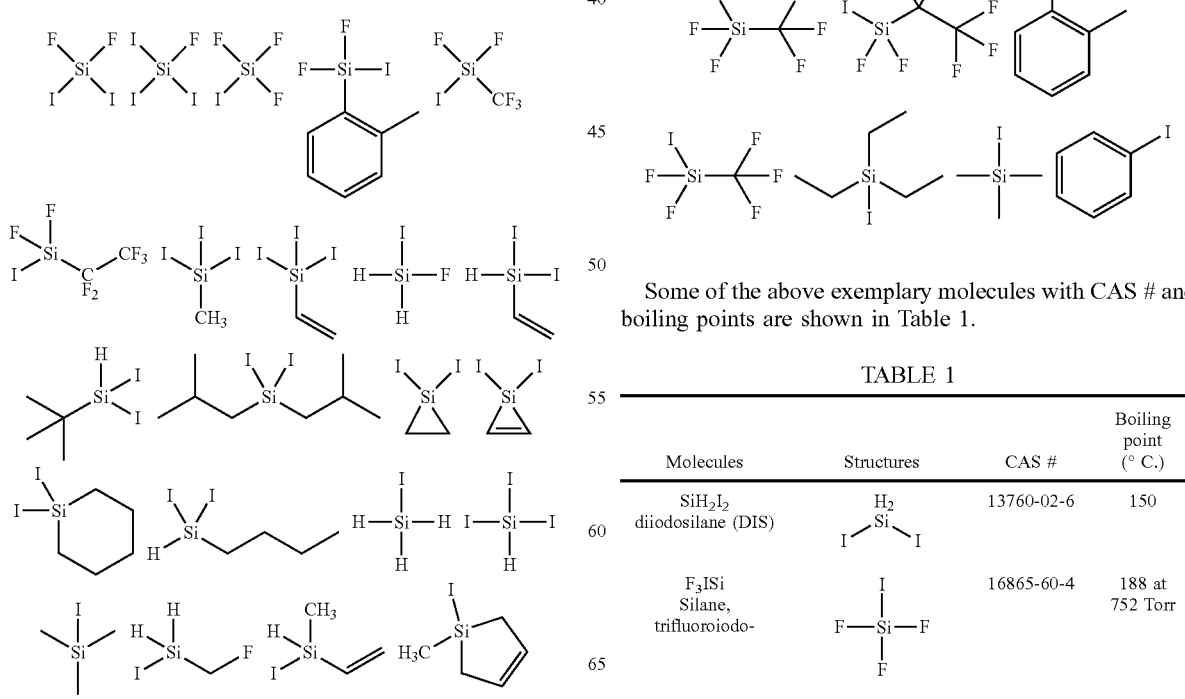

Some of the above exemplary molecules with CAS # and boiling points are shown in Table 1.

TABLE 1

| Molecules | Structures | CAS # | Boiling point (° C.) |
|---|---|---|---|
| SiH$_2$I$_2$ diiodosilane (DIS) | H$_2$Si(I)(I) | 13760-02-6 | 150 |
| F$_3$ISi Silane, trifluoroiodo- | F—Si(F)(F)—I | 16865-60-4 | 188 at 752 Torr |

TABLE 1-continued

| Molecules | Structures | CAS # | Boiling point (° C.) |
|---|---|---|---|
| $F_2I_2Si$ Silane, difluorodiiodo- | | 27669-15-4 | 84.5 at 756 Torr |
| $FI_3Si$ Silane, fluorotriiodo- | | 23338-93-4 | 188 at 752 Torr |
| $FH_2ISi$ Silane, fluoroiodo- | | 82146-22-3 | |
| $CF_5ISi$ Silane, difluoroiodo (trifluoromethyl)- | | 27668-68-4 | 44.3 ± 30.0 at 760 Torr |
| $C_2F_7ISi$ Silane, difluoroiodo (pentafluoroethyl)- | | 36972-59-5 | 52.1 ± 35.0 at 760 Torr |
| $C_7H_7F_2ISi$ 1-(Difluoroiodosilyl)-2-methylbenzene | | 174711-76-3 | 217.3 ± 33.0 at 760 Torr |
| $CF_5ISi$ Difluoroiodo (trifluoromethyl) silane | | 27668-68-4 | 44.3 ± 30.0 at 760 Torr |
| $C_6H_{15}ISi$ Triethyliodosilane | | 1112-49-8 | 190.5 at 744 Torr |
| $C_3H_9ISi$ Trimethylsilyl iodide | | 16029-98-4 | 106-107 |
| $C_6H_5I$ Iodobenzene | | 591-50-4 | 188.4 |

The disclosed passivation molecules with boiling point greater than 20° C. is $SiH_2I_2$ diiodosilane (DIS, CAS #: 13760-02-6, boiling point: 150° C.).

B) Hydrofluorocarbons, $C_xH_yF_z$, wherein $3 \leq x \leq 10$; $0 \leq y \leq 21$; $0 \leq z \leq 21$; $C_3$-$C_{10}$ may be linear, branched or cyclic, saturated or unsaturated, aromatic, heterocyclic, partially or fully fluorinated, substituted or unsubstituted alkyl groups.

Examples of known compounds of this category include: $C_4H_2F_6$, cis-1,1,2,2,3,4-Hexafluorocyclobutane, CAS #: 22819-47-2, boiling Point Value: 63° C.

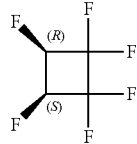

C) I-containing hydrofluorocarbons, $C_nH_xF_yI_z$, with boiling point greater than 20° C., wherein $1 \leq n \leq 10$, $0 \leq x \leq 21$, $0 \leq y \leq 21$, and $1 \leq z \leq 4$. Here, $C_1$-$C_{10}$ may be linear, branched, saturated or unsaturated, partially or fully fluorinated, substituted or unsubstituted alkyl groups. $C_3$-$C_{10}$ may be cyclic, saturated or unsaturated, aromatic, heterocyclic, partially or fully fluorinated, substituted or unsubstituted alkyl groups.

Examples of known compounds of this category include:

| Molecules | Structures | CAS # | Boiling point (° C.) |
|---|---|---|---|
| $CH_3I$ Methyl iodide | —I | 74-88-4 | 42.5 |
| $C_3F_7I$ Perfluoropropyl iodide | | 754-34-7 | 40 |
| $C_3F_7I$ Perfluoroisopropyl iodide | | 677-69-0 | 38 |
| 1-$C_4F_9I$ | | 432-39-2 | 67 |
| $C_2F_3I_3$ 1,1,1-Trifluoro-2,2,2-triiodoethane | | 22085-23-0 | 58-60 |
| $C_3F_5I$ 1,1,2,2,3-Pentafluoro-3-iodocyclopropane | | 22485-44-5 | 67 |
| $C_4F_7I$ 1,1,2,2,3,3,4-Heptafluoro-4-iodocyclobutane | | 377-44-6 | 63 |
| $C_3F_5I$ 1,1,2,3,3-Pentafluoro-3-iodo-1-propene | | 431-65-2 | 53 |

| Molecules | Structures | CAS # | Boiling point (° C.) |
|---|---|---|---|
| $C_4F_5I$ 1,3,3,4,4-Pentafluoro-2-iodocyclobutene | (structure) | 33021-45-3 | 80-81 |

D) N-containing hydrofluorocarbons, $C_nH_xF_yN_z$, with boiling point greater than 20° C., wherein $1 \leq n \leq 10$, $0 \leq x \leq 21$, $0 \leq y \leq 21$, and $1 \leq z \leq 4$. Here, $C_1$-$C_{10}$ may be linear, branched, saturated or unsaturated, partially or fully fluorinated, substituted or unsubstituted alkyl groups. $C_3$-$C_{10}$ may be cyclic, saturated or unsaturated, aromatic, heterocyclic, partially or fully fluorinated, substituted or unsubstituted alkyl groups.

E) S-containing hydrofluorocarbons, $C_nH_xF_yS_z$, with boiling point greater than 20° C., wherein $1 \leq n \leq 10$, $0 \leq x \leq 21$, $0 \leq y \leq 21$, and $1 \leq z \leq 4$. Here, $C_1$-$C_{10}$ may be linear, branched, saturated or unsaturated, partially or fully fluorinated, substituted or unsubstituted alkyl groups. $C_3$-$C_{10}$ may be cyclic, saturated or unsaturated, aromatic, heterocyclic, partially or fully fluorinated, substituted or unsubstituted alkyl groups.

The disclosed etching methods utilizing the passivation molecules comprise multiple steps by alternately switching non-plasma etch step with the passivation molecules and plasm etch step with etch gases or reactive reagents. The disclosed etching methods allow exploring the unique property of passivation molecules, which have been demonstrated in deposition processes, like forming a surface protection layer (or a passivation layer) in etch processes. The etch gases or reactive reagents, preferably fluorocarbon or hydrofluorocarbon gases, have a general formula: $C_xH_yF_z$, where x=1-6, y=0-3, z=1-10. The etch gases or reactive reagents may also include other elements such as I, N, O, S, Br. The preferred fluorocarbon etch gas is a $C_1$-$C_6$ fluorocarbons ($C_xF_y$), such as, $CF_4$, $C_2F_4$, $C_2F_6$, $C_3F_8$, $C_3F_6$, $C_4F_6$, $C_4F_8$, $C_4F_{10}$, $C_5F_8$, or $C_6F_6$ molecule. The preferred hydrofluorocarbon etch gas is a $C_1$-$C_6$ hydrofluorocarbons ($C_xH_aF_y$, where a>0), such as, $CH_3F$, $CH_2F_2$, $CHF_3$, $C_2H_5F$, $C_3H_7F$, $C_4H_2F_6$, $C_3H_2F_6$, or $C_2HF_5$ molecule.

In the disclosed methods, doses of the passivation molecules in the non-plasma etch step may be controlled by chamber pressure and exposure time. Electrostatic chuck (ESC) temperature of plasma etch step could affect the etch performance, while less pronounced effect from that of the non-plasma step. ESC temperature window of non-plasma etch step is less than a vaporization temperature (at a pressure less than atmospheric pressure herein) of the passivation molecule when the passivation molecules condensate on a surface, preferably the same as the temperature of the plasma step. ESC temperature window of the plasma step may be room temperature or 20° C. A wider range of ESC temperature is possible with advance ESC temperature control ability. Depending on how thick the surface protective layer required, the ESC temperature below the vaporization temperature of the passivation molecule may make the passivation molecule stick or condense on the surface. Alternatively, another option is that the doses of the passivation molecules in the non-plasma etch step is done at a temperature that may be higher than the vaporization temperature of the passivation molecule sufficient for chemisorption or chemical reaction of the passivation molecule with the surface of the substrate. In this case, the passivation molecule may be bonded to the surface in a monolayer in the first layer for surface protection, that is, a protective layer or a passivation layer. The chemical reaction between the passivation molecule and the surface for example may be the reaction of the passivation molecule with Si—O, Si—OH, Si—N, etc. bonds that are initially on the surface. Subsequent etch step may be a clean step, used to remove the passivation layer as shown in FIG. 3D, which may be for example a plasma etch step using exemplary gases such as $O_2$ or $CF_4$ to remove the passivation layer. Because the process pressure is <1 atm the boiling point itself (defined at 1 atm) is not the determining factor of whether true condensation will occur but some probability of the molecule will impinge on the surface and have mechanism of adsorption or chemisorption to the surface.

Figure 1B:
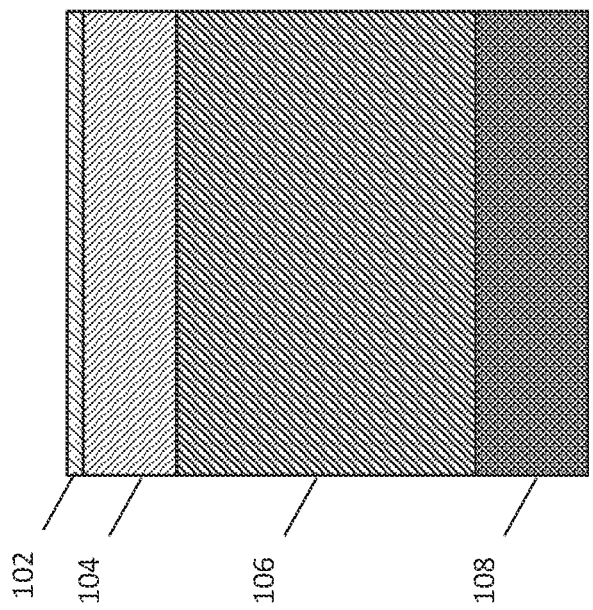
FIG. 1B shows an exemplary patterned structures of oxide hole pattern on Si substrate or a wafer after mask opening.
Figure 2:
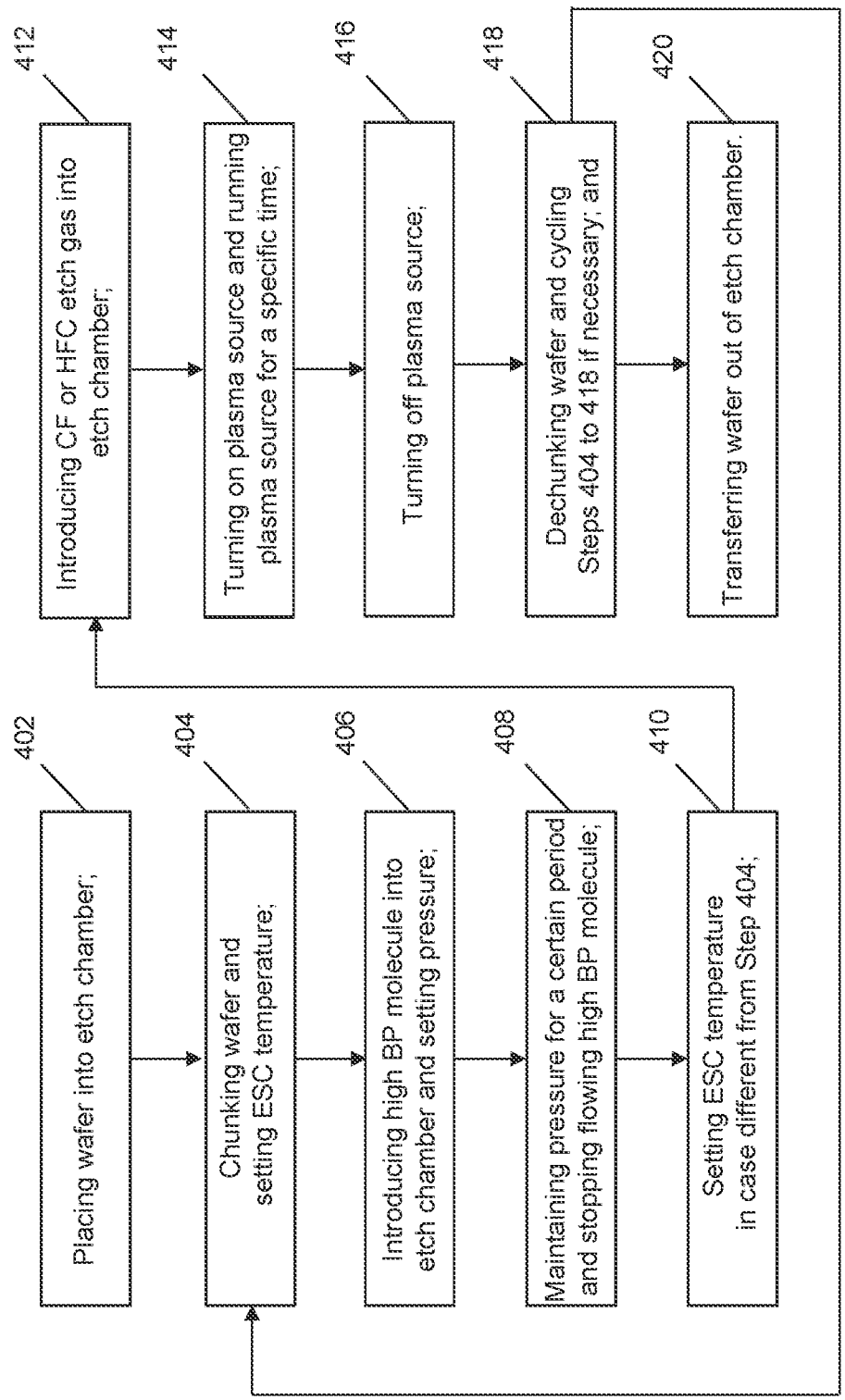
FIG. 2 is a flowchart for an exemplary embodiment of the disclosed etch methods.

FIG. 2 is a flowchart for an exemplary embodiment of the disclosed etch methods with a passivation molecule. First, at Step 402, a wafer with one or more layers (e.g., one or more silicon-based layers) and a patterned mask layer disposed on the one or more layers is placed in an etch chamber of a plasma etcher, that is, a reactor or a reaction chamber, which is pumped down to a high vacuum. Here, the reactor may be an etcher of plasma etch, reactive ion etch, capacitive coupled plasma (CCP), inductive coupled plasma (ICP), remote plasma, pulsed plasma, or ECR plasma. Preferably, the reactor is a CCP plasma etcher. A pressure of the etch chamber may vary from 0.001 torr to 1000 torr. Preferably, the pressure of the etch chamber may vary from 1 mtorr to 1 torr. The pressure of the passivation non-plasma step may be different than the pressure of the plasma etch step. The patterned mask layer may be formed referring to FIG. 1A and FIG. 1B. The patterned mask layer may be an amorphous carbon layer or a silicon material layer with a doped element selected from B, N, Si, Al, Cr, Ti, or W. At Step 404, chunking the wafer to electrostatic chuck (ESC), setting ESC temperature and allowing the ESC temperature to be equilibrated. The temperature in this non-plasma etch step may vary from −150° C. to 100° C., preferably from −50° C. to 50° C. The temperature in this non-plasma etch step may be less than the boiling point of the passivation molecule. At Step 406, a passivation molecule gas is flown or introduced into the etch chamber, and a chamber pressure or process pressure is set and maintained for a certain exposure time, preferably the certain exposure time ranging from 0.01 sec to 10000 seconds, more preferably, from 1 to 30 seconds, to allow the passivation molecule condense and/or absorbed on the wafer surface to form a surface protective layer or a surface passivation layer. Here an inert gas may be introduced into the etch chamber together with the passivation molecule gas, that is, a mixture of the passivation molecule gas and the inert gas (Ar, Ne, Kr, Xe, $N_2$) may be introduced into the etch chamber. This process may be a physical condensation or chemical surface reaction forming a modified layer, like a protection layer, on the surface of the wafer. The flow rates for the passivation molecule gas may vary from 1 sccm to 10000 sccm, preferably vary from 100 sccm to 1000 sccm. The flow rates for the mixture of the passivation molecule and the inert gas (Ar, Ne, Kr, Xe, $N_2$) may vary from 1 sccm to 10000 sccm, preferably vary from 100 sccm to 1000 sccm, if the inert gas Ar, Ne, Kr, Xe, $N_2$) is applied. These flow rates will depend on the properties of the molecule and the chamber configuration and size. After the certain exposure time, stopping flowing the passivation molecule gas or the mixture of the passivation molecule and inert (e.g., Ar, Ne, Kr, Xe) gas into the etch chamber, evacuating the residual gas mixture inside the etch chamber and pumping the etch chamber down to a high vacuum at Step 408. The chamber pressure and the exposure time may control the flow rate or doses of the passivation molecules in the above non-plasma etch process. In the following Step 410, a plasma etch process begins. The ESC temperature is set and allowed to be equilibrated, in case different ESC temperature as that in Step 404 is required. The ESC temperature in plasma etch process may be the same as that in non-plasma etch process set in step 404. The ESC temperature in plasma etch process may range from −150° C. to 50° C., preferably, room temperature or 20° C. One or more etch gas, such as fluorocarbon or hydrofluorocarbon (e.g., $C_xH_yF_z$, x=1-6, a=0-7, y=0-10) etch gases, are then flown or introduced into the etch chamber and allowed to be equilibrated and an inert (e.g., Ar, Ne, Kr, Xe) gas is optionally flown into the etch chamber with the etch gas and allowed to be equilibrated at Step 412. The preferred fluorocarbon gas is one or more $C_1$-$C_6$ $C_xF_y$ molecules selected from $CF_4$, $C_2F_4$, $C_2F_6$, $C_3F_8$, $C_3F_6$, $C_4F_6$, $C_4F_8$, $C_4F_{10}$, $C_5F_8$, or $C_6F_6$. The preferred hydrofluorocarbon gas is one or more $C_1$-$C_6$ $C_xH_aF_y$ molecules where a>0, selected from $CH_3F$, $CH_2F_2$, $CHF_3$, $C_2H_5F$, $C_3H_7F$, $C_4H_2F_6$, $C_3H_2F_6$, or $C_2HF_5$. The flow rates for fluorocarbon or hydrofluorocarbon etch gas may vary from 1 sccm to 10000 sccm, preferably, from 10 sccm to 100 sccm. In the next step, Step 414, a plasma source power is turned on to ignite plasma; a bias power is turned on to set plasma bias. Then this plasma process is kept running for a specified time, preferably, for a specified exposure time from 0.01 s to 10000 s, more preferably, from 0.01 to 30 s. The source plasma power may vary from 10 W to 20000 W, preferably, from 100 W to 3000 W. The bias plasma power may vary from 10 W to 100,000 W. The source plasma may be in continuous mode or pulse mode with pulsing frequency from 1 Hz to 10000 Hz, preferably from 100 Hz to 1000 Hz. The bias plasma may be in continuous mode or pulse mode with pulsing frequency from 1 Hz to 10000 Hz. In this step, the etch gas is plasma activated. The plasma activated etch gas plasma dry etches the one or more layers in the wafer, thereby forming apertures over the patterned mask layer in the one or more layers. After running the plasma process for the specified exposure time, all plasma source power are turned off at Step 416. Then the gases in the etch chamber are evacuated and the etch chamber is pumped down to a high vacuum. Afterward, dechucking the wafer from ESC at Step 418 and transferring the wafer out of the etch chamber at Step 420. If necessary, Step 404 to 418 may be cycled until a desired etch depth of the apertures is achieved and a surface protective layer is also formed on the sidewall of the apertures. Here, the certain exposure time at the non-plasma etch process and the specified exposure time at the plasma dry etch process in each subsequent cycle may be modified. Additional steps may be required to remove the surface protective layer or any other passivation chemistries from the surface of the wafer. These cleaning steps may involve plasma or wet processes. Plasma processes may include such chemistries as $O_2$ or $CF_4$. Wet processes may include water, organic solvents, or acids such as HF.

Any of the above steps may be conducted in a static or dynamic mode. The static mode means that the gases are flowing into a closed reaction chamber, that is, a gate valve on the closed reaction chamber is closed. The dynamic mode means that the gases are dynamically flowing in the vacuum etch chamber with the gate valve to a vacuum pump open.

The closed reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™. The RF power in such may be pulsed to control plasma properties and thereby improving the etch performance (selectivity and damage) further.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two 0 radicals. Preferably, the remote plasma may be generated with a power ranging from about 1 kW to about 10 kW, more preferably from about 2.5 kW to about 7.5 kW.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, Ge, SiGe, GeSn, InGaAs, GaSb, InP, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, Ga, In, Sn, Sb, Bi and/or Ge), silica, silicon nitride, silicon oxide, silicon oxynitride, $Si_aO_bH_cC_dN_e$, (wherein a>0; b, c, d, e≥O), Ge, SiGe, GeSn, InGaAs, GaSb, InP; mask layer materials such as amorphous carbon with or without dopants, antireflective coatings, photoresist materials, a metal oxide, such as AlO, TiO, HfO, ZrO, SnO, TaO etc. or a metal nitride layer such as AlN, ZrN, SnN, HfN, titanium nitride, tantalum nitride etc. or combinations thereof; etch stop layer materials such as silicon nitride, polysilicon, crystalline silicon, silicon carbide, SiON, SiCN or combinations thereof, device channel materials such crystalline silicon, epitaxial silicon, doped silicon, $Si_aO_bH_cC_dN_e$, (wherein a>0; b, c, d, e≥0) or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

The vapor of the disclosed passivation molecules and the vapor of the fluorocarbons or hydrofluorocarbons are introduced into the reaction chamber containing the substrate and silicon-containing films deposited thereon, respectively. The vapors may be introduced to the chamber at a flow rate ranging from approximately 0.1 sccm to approximately 1 slm. For example, for a 200 mm wafer size, the vapors may be introduced to the chamber at a flow rate ranging from approximately 5 sccm to approximately 50 sccm. Alternatively, for a 450 mm wafer size, the vapors may be introduced to the chamber at a flow rate ranging from approximately 25 sccm to approximately 250 sccm. One of ordinary skill in the art will recognize that the flow rate may vary from tool to tool.

The vapor of the disclosed passivation molecules and the vapor of the fluorocarbons or hydrofluorocarbons may be supplied either in neat form or in a blend with an inert gas, such as $N_2$, Ar, Kr, Ne He, Xe, etc., or solvent. The vapor of the disclosed passivation molecules and the vapor of the fluorocarbons may be present in varying concentrations in the blend.

Additionally, the disclosed passivation molecules and the fluorocarbon or hydrofluorocarbon etching gas are delivered in purity ranging from 95% to 99.999% by volume and may be purified with known standard purification techniques for removal of CO, $CO_2$, $N_2$, $H_2O$, HF, $H_2S$, $SO_2$, halides, and other hydrocarbons or hydrohalocarbons.

An inert gas may be also introduced into the reaction chamber in order to sustain the plasma in Step 2). The fluorocarbon or hydrofluorocarbon inert gas may be He, Ar, Xe, Kr, Ne, $N_2$, He or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The vapor of the fluorocarbon or hydrofluorocarbon etching gas and inert gas are activated by plasma to produce an activated etching gas in Step 2). The plasma decomposes the etching gas into radical form (i.e., the activated etching gas). The plasma may be generated by applying RF or DC power. The plasma may be generated with a RF power ranging from about 25 W to about 100,000 W. The plasma may be generated remotely or within the reactor itself. The plasma may be generated in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/ion measurement tools may measure the activated etching gas from the chamber exhaust to determine the types and numbers of species produced. If necessary, the flow rate of the etching gas and/or the inert gas may be adjusted to increase or decrease the number of radical species produced.

The disclosed passivation molecules and fluorocarbon or hydrofluorocarbon etching gases may be, respectively, mixed with other gases either prior to introduction into the reaction chamber or inside the reaction chamber. Preferably, the gases may be mixed prior to introduction to the chamber in order to provide a uniform concentration of the entering gas.

In another alternative, the vapor of disclosed passivation molecules and the vapor of the fluorocarbon or hydrofluorocarbon etching gas may be, respectively, introduced into the chamber independently from the other gases, such as when two or more of the gases react or are easier to deliver independently.

In another alternative, the vapor of disclosed passivation molecules and the inert gas, and the vapor of the fluorocarbon or hydrofluorocarbon etching gas and the inert gas are the only two gases that are used during the etching process, respectively. Here, the vapor of disclosed passivation molecules and the vapor of the fluorocarbon or hydrofluorocarbon etching gas may or may not mix with the inert gas, respectively.

Exemplary other gases include, without limitation, oxidizers such as $O_2$, $O_3$, CO, $CO_2$, NO, $N_2O$, $NO_2$, $H_2O$, $H_2O_2$, COS, $SO_2$ and combinations thereof. The vapor of the disclosed passivation molecules and the oxidizer, and the vapor of the fluorocarbon or hydrofluorocarbon etching gas and the oxidizer may be mixed together prior to introduction into the reaction chamber, respectively.

Alternatively, the oxidizer may be introduced continuously into the chamber and the vapor of the disclosed passivation molecules and the vapor of the fluorocarbon or hydrofluorocarbon etching gas may be introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

The silicon-containing films and the activated fluorocarbon or hydrofluorocarbon etching gas react to form volatile by-products that are removed from the reaction chamber. The a-C mask, antireflective coating, and photoresist layer are less reactive with the activated etching gas. Thus, the activated etching gas selectively reacts with the silicon-containing films to form volatile by-products.

The reactions between the silicon-containing film and the activated etching gas result in anisotropic removal of the silicon-containing films from the substrate. Atoms of nitrogen, oxygen, and/or carbon may also be present in the silicon-containing film. The removal is due to a physical sputtering of silicon-containing film from plasma ions (accelerated by the plasma) and/or by chemical reaction of plasma species to convert Si to volatile species, such as $SiF_x$, wherein x ranges from 1-4.

The disclosed etching method with alternating non-plasma and plasma processes preferably exhibits high selectivity toward the mask and etches through the oxide layer or alternating layers of SiO and SiN resulting in a vertical etch profile with no bowing or roughness, which is important for 3D NAND applications. Additionally, plasma activated vapor deposits surface protective layer on sidewall to minimize feature profile deformation. For other applications, such as DRAM and 2D NAND, for example, the plasma activated etching gas under different process conditions may selectively etch SiO from SiN. The plasma activated etching gas may selectively etch SiO and/or SiN from mask layers, such as a-C, photoresist, p-Si, or silicon carbide; or from metal contact layers, such as Cu, W, Ru, etc.; or from channel regions consisting of SiGe or polysilicon regions.

The disclosed etching method with alternating non-plasma and plasma processes produce apertures such as channel holes, gate trenches, staircase contacts, capacitor holes, contact holes, contact etch, slit etch, self-aligned contact, self-aligned vias, super vias etc., in the silicon-containing films. The resulting apertures may have an aspect ratio ranging from approximately 1:1 to approximately 500:1, preferably from approximately 20:1 to approximately 400:1; and a diameter ranging from approximately 5 nm to approximately 500 nm, preferably less than 100 nm. For example, one of ordinary skill in the art will recognize that a channel hole etch produces apertures in the silicon-containing films having an aspect ratio greater than 50:1.

Typical materials that need to be etched may be SiO. A process of etching SiO may be relevant to etching trenches in Borophosphosilicateglass (BPSG), Tetraethylorthosilicate (TEOS), or low deposition rate TEOS (LDTEOS). An etch stop layer may be silicon nitride or silicon oxygen nitride (SiON) or poly silicon. A mask material used may be a-C, p-Si, or photo resist materials. Herein, the disclosed iodine-containing etching compounds are applied to etch SiO, SiN, p-Si and/or a-C substrate films.

Dielectric layers in the wafer to be etched may include SiN, $SiO_2$, SiC, SiCN, SiON, deposited on Si substrate. Mask layer materials may be amorphous carbon (a-C) or silicon materials with other elements doped, such as B, N, Si, Al, Cr, Ti, and W. The fluorocarbon or hydrofluorocarbon gas may be a range of $C_xH_yF_z$ molecules where X=1-6, Y=0-3, Z=1-10 where the fluorocarbon or hydrofluorocarbon molecule may also include other elements such as I, N, O, S, Br. Oxygen $O_2$ or a different oxygen source such as CO, $CO_2$, NO, $NO_2$, $N_2O$ may be added to the etch chamber with a flow rate from 1 sccm to 10000 sccm for a control of polymerization of the etching step.

With the disclosed methods, the etch selectivity of dielectric materials, such as SiO, to a-C mask may be improved by over 20%; the etch selectivity of multilayers SiO/SiN ONON layer to a-C mask may be improved by over 10%. In addition, the advantage of the disclosed method may include an improvement of etched profile during HAR dielectric etch. Profile bowing may be reduced under certain conditions.

EXAMPLES

The following non-limiting examples are provided to further illustrate embodiments of the invention. However, the examples are not intended to be all inclusive and are not intended to limit the scope of the inventions described herein.

The disclosed methods have been tested on a commercial dual CCP plasma etch tool using passivation $SiH_2I_2$ (boiling point: 150° C.) for oxide hole pattern wafer etch.

Wafer information: An exemplary patterned structure for forming an oxide aperture pattern on Si substrate or a wafer is shown in FIG. 1A and FIG. 1B. FIG. 1A shows the pattern structure before mask opening. The $SiO_2$ layer 106 is disposed on Si substrate 108. The a-C mask layer 104 is disposed on the $SiO_2$ layer 106. The SiON resist layer 102 is dispose on the mask layer 104. FIG. 1B shows the mask openings 110 are formed in the mask layer 104 in the pattern structure after mask opening. In one embodiment for the Examples below, the thickness of the SiON resist layer 102 was 100 nm; the a-C mask layer 104 was 700 nm; the $SiO_2$ layer 106 was 3 µm; the mask opening 110 ranged from 140 nm to 160 nm.

Etching experiments below were conducted on commercially available $SiO_2$ hole pattern wafers with a 3 µm $SiO_2$ layer on Si substrate and on top is a 641 nm a-C mask with a hole CD of 164 nm prior to etching.

Example 1: Forming a Surface Protective Layer Using $SiH_2I_2$

This example is utilizing adsorption or physical condensation of passivation molecules to form a surface protective layer on the wafer surface before plasma etching. More specifically, utilizing the adsorption or physical condensation of passivation $SiH_2I_2$ (DIS or diiodosilane) to form a surface thin layer on the wafer surface before plasma etching.

Figures 3A, 3B:
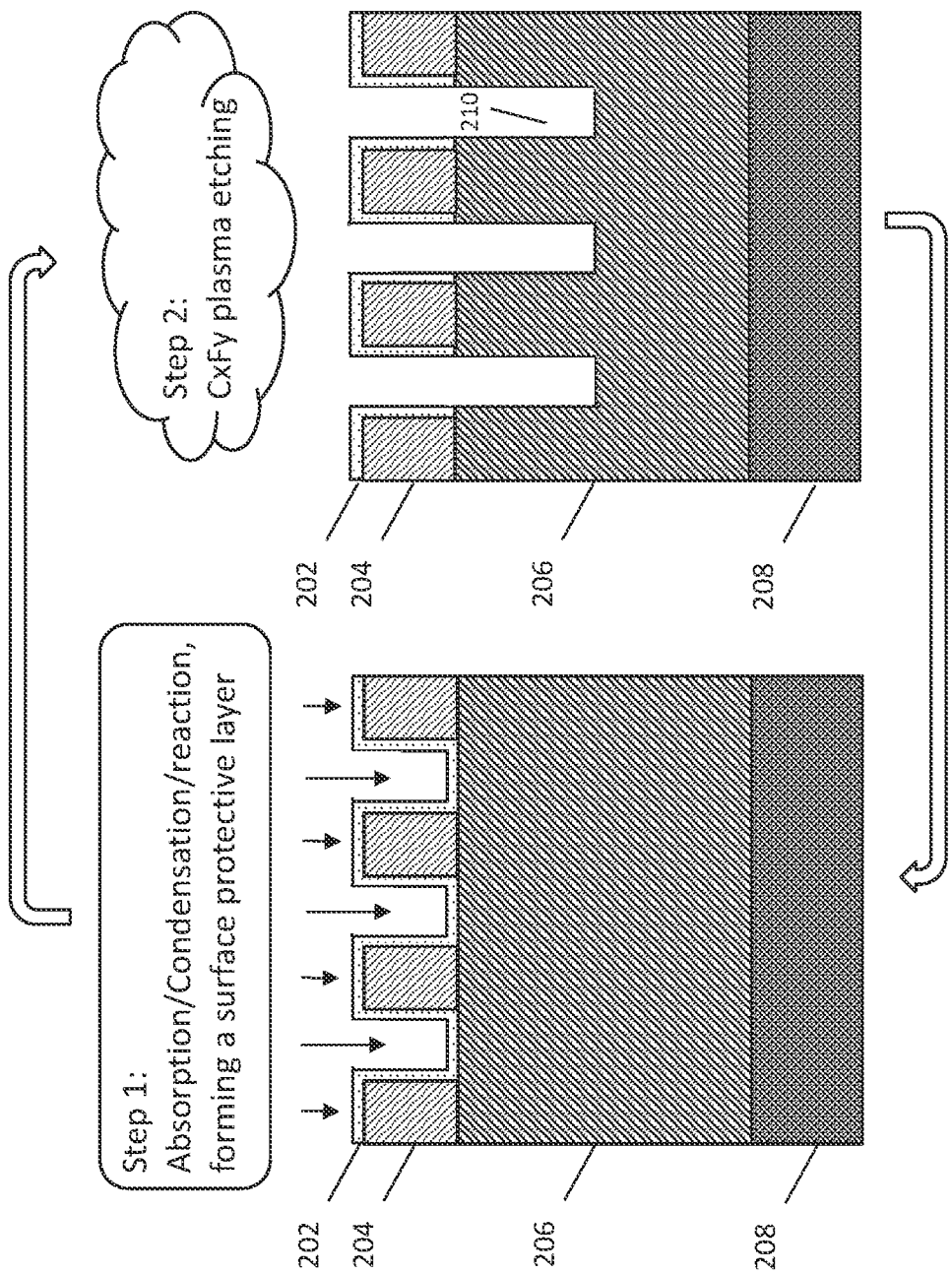
FIG. 3A shows a non-plasma etch application using $SiH_2I_2$ in a HAR dielectric etching process.
FIG. 3B shows a plasma etch application using a fluorocarbon etch gas $C_4F_6$ in a HAR dielectric etching process.

FIG. 3A shows a non-plasma etch application using $SiH_2I_2$ in a HAR dielectric etching process. As shown, Step 1: forming a surface protective layer on the patterned mask layer. A $SiH_2I_2$/Ar mixture was flown into an etch chamber or the dual CCP plasma etch tool and a wafer was exposed in the etch chamber for a certain period. No source and bias plasma were added into the etch chamber. An ESC temperature of this non-plasma etch step was set. A surface protective layer 202 was then formed on the patterned mask layer 204 after a specific time, such as, 60, 120 or 180 seconds, or the like, which may be a surface condensation layer or a surface reaction layer formed on the patterned mask layer 204. Here a portion of the surface protective layer 202 was formed on the $SiO_2$ layer 206 with the mask layer patterns.

FIG. 3B shows a plasma etch application using a fluorocarbon etch gas $C_4F_6$ in a HAR dielectric etching process after forming the surface protective layer on the patterned mask layer. As shown, Step 2: plasma etching with the fluorocarbon etch gas $C_4F_6$. At this step, an oxidizer (e.g., $O_2$) and an inert gas (e.g., Ar) may be added to the fluorocarbon etch gas $C_4F_6$, and the ESC temperature may be the same as or different from Step 1 in the non-plasma process. A plasma source and a bias plasma were added into the etch chamber at this step and run for a specific time, for example, 60, 120, 180 seconds, but not limited to. The fluorocarbon etch gas $C_4F_6$ was flown into the etch chamber and etched the portion of the surface protective layer 202 right on top of the $SiO_2$ layer 206 and further etched the $SiO_2$ layer 206 versus the patterned mask layer 204, thereby forming a deep aperture 210 in the $SiO_2$ layer 206.

Here, Step 1 and Step 2 may be cycled or alternatingly run, if necessary, until a desired deep aperture 210 is formed in the $SiO_2$ layer 206. The specific run times for both steps may be modified in each step in subsequent cycles. Between each step, that is, between Step 1 and Step 2 and between Step 2 and Step 1, there may be a purging step with inert gas or a pump down using a vacuum pump to a process pressure or the base pressure of the pump.

Figure 3C:
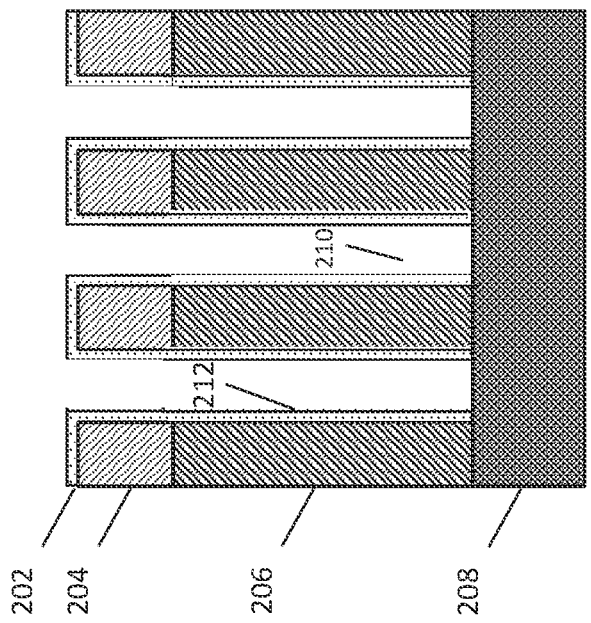
FIG. 3C shows an oxide hole pattern formed in a substrate through a non-plasma formation of a surface protective layer and a plasma etch of holes.
Figure 3D:
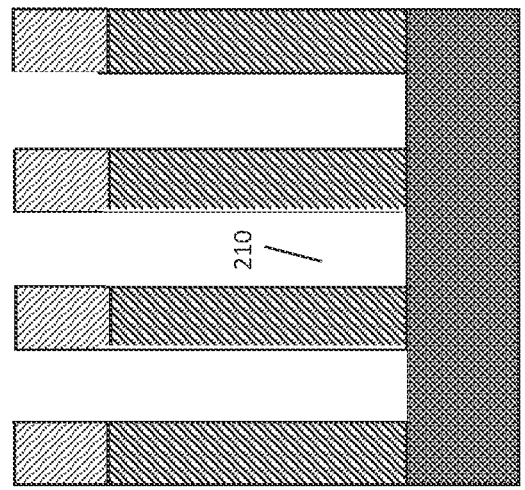
FIG. 3D shows an oxide hole pattern formed in a substrate with removal of a surface protective layer formed by a non-plasma formation.

FIG. 3C shows an oxide aperture pattern formed in a patterned structure on Si substrate 208 through $SiH_2I_2$ non-plasma formation of a surface protective layer and $C_4F_6$ plasma etch. During this process, the formation of the surface protective layer and the etch of the $SiO_2$ layer 206 were sequentially performed in cycles, so that a surface protective layer 212 was formed on the sidewall of the aperture 210 in the $SiO_2$ layer 206. The formation of the surface protective layer 212 and the etch of the $SiO_2$ layer 206 are not proceeded simultaneously. The surface protective layer 212 on the side wall of the aperture 210 in the $SiO_2$ layer 206 was continuously grown down from the surface protective layer 202 on the patterned mask layer 204 with the processes of Step 1 and Step 2 alternatingly going until a deep aperture 210 was formed with the surface protective layer 212, as shown in FIG. 3C. After that, a plasma etching cleaning step may be applied to remove the protective layer 202 and 212, shown in FIG. 3D.

The disclosed method was tested on the oxide aperture pattern wafer under varied conditions. The conditions for Step 1 of non-plasma exposure process were tuned for observing profile (e.g., CD, bowing, etc.) and selectivity. Variables including ESC temperature, chamber pressure, and exposure time for the non-plasma exposure process and the properties of the oxide aperture pattern are listed in Table 3 and Table 4, respectively. The conditions for Step 1 of non-plasma exposure process tuned for decouple the ESC in Step 1 and Step 2 are shown in Table 5 and Table 6. Between Step 1 and Step 2 the chamber was pumped down with a vacuum pump.

TABLE 3

| Process | Step | RF (W) 60 M | RF (W) 2 M | Pulse parameter DC (%) | Pulse parameter Fr (Hz) | Pressure (mtorr) | Etch gas (sccm) C$_4$F$_6$ | Etch gas (sccm) SiH$_2$I$_2$/Ar mixture | Etch gas (sccm) O$_2$ | Etch gas (sccm) Ar | ESC temp (° C.) | Time (sec) |
|---|---|---|---|---|---|---|---|---|---|---|---|---|
| Non-plasma exposure | 1 | — | — | — | — | vary | — | 150 | — | — | vary | vary |
| Plasma etch | 2 | 700/200 | 7000/200 | 70 | 500 | 20 | 32 | | 34 | 150 | vary | 60 |

TABLE 4

| Variable | Baseline No Step 1 | Pressure (mtorr) at ESC 10° C. with exposure 30 sec | | | ESC temperature at 200 mtorr with exposure 30 sec | | | Exposure time (sec) at 200 mtorr, 20° C. | | |
|---|---|---|---|---|---|---|---|---|---|---|
| | | 200 | 400 | 600 | 10° C. | 20° C. | 30° C. | 60 | 120 | 300 |
| a-C mask thickness (μm) | 0.60 | 0.61 | 0.63 | 0.63 | 0.62 | 0.63 | 0.62 | 0.63 | 0.63 | 0.63 |
| Top CD (μm) | 0.16 | 0.16 | 0.17 | 0.16 | 0.16 | 0.17 | 0.16 | 0.17 | 0.16 | 0.16 |
| Bottom CD (μm) | 0.10 | 0.11 | 0.13 | 0.13 | 0.13 | 0.15 | 0.14 | 0.14 | 0.14 | 0.14 |

TABLE 5

| Process | Step | RF (W) 60 M | RF (W) 2 M | Pulse parameter DC (%) | Pulse parameter Fr (Hz) | Pressure (mtorr) | Etch gas (sccm) C$_4$F$_6$ | Etch gas (sccm) SiH$_2$I$_2$/Ar mixture | Etch gas (sccm) O$_2$ | Etch gas (sccm) Ar | ESC temp (° C.) | Time (sec) |
|---|---|---|---|---|---|---|---|---|---|---|---|---|
| Non-plasma exposure | 1 | — | — | — | — | 200 | — | 150 | — | — | vary | 60 |
| Plasma etch | 2 | 700/200 | 7000/200 | 70 | 500 | 20 | 32 | | 34 | 150 | 20 | 60 |

TABLE 6

| Variables | Baseline No Step 1 | Exposure temperature in Step 1 | | |
|---|---|---|---|---|
| | | 10° C. | 20° C. | 30° C. |
| a-C mask thickness (μm) | 0.60 | 0.61 | 0.62 | 0.62 |
| Top CD (μm) | 0.16 | 0.16 | 0.17 | 0.17 |
| Bottom CD (μm) | 0.10 | 0.10 | 0.14 | 0.14 |

In the disclosed method, dose of the chemicals in non-plasma etch step may be controlled by chamber pressure and exposure time. That is, the chamber pressure may range from 20 mtorr to 400 torr and the exposure time of non-plasma etch step may be <120 s. Excess dose may cause necking on the top portion of the mask hole (i.e., 110 in FIG. 1B). The ESC temperature window of non-plasma etch step may be less than the boiling point of SiH$_2$I$_2$, preferably the same as the plasma step—Step 2. The ESC temperature window of the plasma step may be room temperature or 20° C., a wider range may be possible with advance ESC temp control ability. The disclosed method improves the etch profile and the selectivity to mask.

An example of selected conditions for non-plasma/plasma steps are shown in Table 7. Cycling results of non-plasma/plasma steps are shown in Table 8.

TABLE 7

| Process | Step | RF (W) 60 M | RF (W) 2 M | Pulse parameter DC (%) | Pulse parameter Fr (Hz) | Pressure (mtorr) | Etch gas (sccm) C$_4$F$_6$ | Etch gas (sccm) SiH$_2$I$_2$/Ar mixture | Etch gas (sccm) O$_2$ | Etch gas (sccm) Ar | ESC temp (° C.) | Time (sec) |
|---|---|---|---|---|---|---|---|---|---|---|---|---|
| Non-plasma exposure | 1 | — | — | — | — | 200 | — | 150 | — | — | 20 | 60 |
| Plasma etch | 2 | 700/200 | 7000/200 | 70 | 500 | 20 | 32 | | 34 | 150 | 20 | 60 |

TABLE 8

| Variable | Step 2 only 60 s | 1 cycle* | Step 2 only 120 s | 2 cycles** | Step 2 only 180 s | 3 cycles | Step 2 only 240 s | 4 cycles | Step 2 only 300 s | 5 cycles |
|---|---|---|---|---|---|---|---|---|---|---|
| Oxide: a-C selectivity | 5.9 | 7.0 | 5.6 | 6.6 | 5.8 | 7.4 | 5.7 | 7.5 | 5.7 | 7.3 |
| TOP CD (μm) | 0.16 | 0.17 | 0.14 | 0.17 | 0.16 | 0.17 | 0.16 | 0.17 | 0.20 | 0.17 |
| Bottom CD (μm) | 0.10 | 0.14 | 0.11 | 0.13 | 0.13 | 0.15 | 0.13 | 0.14 | 0.12 | 0.15 |
| Bowing (μm) | — | — | 0.03 | — | 0.04 | 0.04 | 0.05 | 0.04 | 0.03 | 0.05 |

*1 cycle represents a round route of Step 1 and Step 2.
**2 cycles represent two round routes of Step 1 and Step 2.
And so on.

Example 2. Comparative Example Between $SiH_2I_2$ and $CHF_3$ in Non-Plasma Step $CHF_3$ (boiling point −82.1° C.) was tested under the same condition (5 cycles, each cycle is 60 s as shown in Table 8) as a control sample to $SiH_2I_2$, also as a reference to prior art US20210020450A1. In these tests, the ESC temperature was set to 20° C. Unlike $SiH_2I_2$, when flowing $CHF_3$ to the etch chamber (150 sccm, 200 mtorr, 60 s) and exposing the wafer sample before introducing plasma etch step, no improvement of etch selectivity to a-C mask was observed. Due to the nature of $CHF_3$, when the ESC temperature was set to 20° C., $CHF_3$ molecule may not attach to the wafer sample surface to form a surface reaction layer or a surface protective layer. Therefore, it is believed that the disclosed method hereby may not work on the low boiling point molecules (that is, the molecules have the boiling point lower than 20° C.). More specifically, the disclosed method may be effective only when the boiling point of the etch gas used in the non-plasma etch step is greater than the process temperature in the non-plasma step, as shown in FIG. 3A.

As a direct comparison between $SiH_2I_2$ and $CHF_3$, Table 9 show data where the non-plasma cyclic etch step was performed with $CHF_3$ at an ESC temperature of 20° C. As may be seen from the direct comparison when $SiH_2I_2$ is used in the non-plasma cyclic etch step, the selectivity increases from 5.7 (baseline continuous etch process without $SiH_2I_2$) to 7.3 (non-plasma, cyclic etch), where when $CHF_3$ is used in the non-plasma cyclic etch step, the selectivity is essentially unchanged vs the baseline continuous etch process (6.8 vs 7.0 respectively).

TABLE 9

| Conditions | $SiH_2I_2$, non-plasma, cyclic etch vs Baseline, continuous | $CHF_3$, non-plasma, cyclic etch vs Baseline, continuous |
|---|---|---|
| Oxide: a-C selectivity | 28% | −2.9% |
| TOP CD (μm) | −17% | 0 |
| Bottom CD (μm) | 33% | 0 |
| Bowing (μm) | 66.7% | −14.3% |

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming an aperture pattern in a substrate, the substrate including a film disposed thereon and a patterned mask layer disposed on the film, the method comprising the steps of:
    1) exposing the substrate to a vapor of a passivation molecule in a non-plasma condition for a period to form a surface protective layer on the patterned mask layer;
    2) exposing the substrate to a plasma activated etch gas and plasma dry etching the substrate to form apertures over the patterned mask layer in the film with the plasma activated etch gas; and
    3) repeating step 1) to 2) until a desired aperture pattern is formed in the film,
   wherein the surface protective layer is also formed on the sidewalls of the apertures formed in the film,
    wherein the passivation molecule is selected from the group consisting of halogen-containing silanes, I-containing hydrofluorocarbons, N-containing hydrofluorocarbons and S-containing hydrofluorocarbons.
2. The method of claim 1, wherein a vaporization temperature of the passivation molecule is greater than a process temperature in step 1).
3. The method of claim 2, wherein the process temperature in step 1) is the same as a process temperature in step 2).
4. The method of claim 3, wherein the process temperature in step 2) ranges from −150° C. to 50° C.
5. The method of claim 3, wherein the process temperature in step 2) is 20° C.
6. The method of claim 2, wherein the process temperature in step 1) ranges from −150° C. to 100° C.

7. The method of claim 1, wherein the passivation molecule has a boiling point equal to or larger than 20° C.

8. The method of claim 1, wherein the passivation molecule is $SiH_2I_2$.

9. The method of claim 1, wherein the passivation molecule is mixed with an inert gas selected from Ar, $N_2$, Xe, Kr, Ne, or combinations thereof.

10. The method of claim 1, wherein the etch gas has a formula: $C_xH_yF_z$, where x=1-6, y=0-3, z=1-10.

11. The method of claim 1, wherein the etch gas is a $C_1$-$C_6$ fluorocarbon gas selected from $CF_4$, $C_2F_4$, $C_2F_6$, $C_3F_8$, $C_3F_6$, $C_4F_6$, $C_4F_8$, $C_4F_{10}$, $C_5F_8$ or $C_6F_6$, or a $C_1$-$C_6$ hydrofluorocarbon gas selected from $CH_3F$, $CH_2F_2$, $CHF_3$, $C_2H_5F$, $C_3H_7F$, $C_4H_2F_6$, $C_3H_2F_6$, or $C_2HF_5$.

12. The method of claim 1, wherein a process pressure in step 1) ranges from 0.001 torr to 50 torr.

13. The method of claim 1, wherein the period in step 1) varies from 0.01 sec to 10000 sec.

14. The method of claim 1, wherein a plasma process time in step 2) varies from 0.01 sec to 10000 sec.

15. The method of claim 1, wherein the film is a $SiO_2$, SiN, SiC, SiCN, or SiON layer or an alternating SiO/SiN or SiO/p-Si layer.

16. The method of claim 1, further comprising adding an oxidizer selected from $O_2$, CO, $CO_2$, NO, $NO_2$, $N_2O$ to the plasma activated etch gas, wherein the oxidizer is plasma activated.

17. A method for forming an aperture pattern in a substrate, the substrate including an oxide layer disposed thereon and a patterned mask layer disposed on the oxide layer, the method comprising:
   1) exposing the substrate to a gas of a passivation molecule in a non-plasma condition for a period to form a surface protective layer on the patterned mask layer;
   2) exposing the substrate to a plasma activated etch gas and plasma dry etching the substrate to form apertures over the patterned mask layer in the oxide layer with the plasma activated etch gas; and
   3) repeating step 1) to 2) until a desired oxide aperture pattern is formed in the oxide layer,
   wherein the surface protective layer is also formed on the sidewalls of the apertures in the oxide layer,
   wherein the passivation molecule is selected from the group consisting of halogen-containing silanes, I-containing hydrofluorocarbons, N-containing hydrofluorocarbons and S-containing hydrofluorocarbons.

18. The method of claim 17, wherein a vaporization temperature of the passivation molecule is greater than a process temperature in step 1).

19. A method forming an aperture pattern in a substrate, the substrate including a film disposed thereon and a patterned mask layer disposed on the film, the method comprising:
   1) exposing the substrate to $SiH_2I_2$ vapor in a non-plasma condition for a period to form a surface protective layer on the patterned mask layer;
   2) exposing the substrate to a plasma activated fluorocarbon or hydrofluorocarbon etch gas and plasma dry etching the substrate to form apertures over the patterned mask layer in the film with the plasma activated fluorocarbon or hydrofluorocarbon etch gas; and
   3) repeating step 1) to 2) until a desired aperture pattern is formed in the film,
   wherein the surface protective layer is also formed on the sidewalls of the apertures in the film.

* * * * *